United States Patent [19]

Mooney et al.

[11] Patent Number: 4,706,350

[45] Date of Patent: Nov. 17, 1987

[54] SELF-LOCATING, SELF-FIXTURING HARD CRYSTAL BLANK MOUNTING SYSTEM

[75] Inventors: Charles W. Mooney, Lake Worth; Robert E. Phipps, Pompano Beach; William J. Kuznicki, Coral Springs, all of Fla.

[73] Assignee: Motorola, Inc., Schaumburg, Ill.

[21] Appl. No.: 877,035

[22] Filed: Jun. 23, 1986

Related U.S. Application Data

[63] Continuation-in-part of Ser. No. 689,639, Jan. 7, 1985, abandoned.

[51] Int. Cl.$^4$ ............................................. H04R 17/00
[52] U.S. Cl. ..................................... 29/25.35; 29/418; 310/348
[58] Field of Search .............................. 29/25.35, 418; 174/52 H; 310/354, 355, 356, 348

[56] References Cited

U.S. PATENT DOCUMENTS

| | | | |
|---|---|---|---|
| 2,434,903 | 1/1948 | Bokovoy | 310/356 |
| 2,440,064 | 4/1948 | Arnold et al. | 310/348 |
| 2,806,966 | 9/1957 | Silver | 310/356 |
| 3,857,146 | 12/1974 | Engdahl | 29/25.35 |
| 4,484,158 | 11/1984 | Roberts et al. | 29/25.35 |
| 4,550,475 | 11/1985 | Ishigami et al. | 29/25.35 |

Primary Examiner—P. W. Echols
Attorney, Agent, or Firm—Joseph T. Downey; Anthony J. Sarli, Jr.; Donald B. Southard

[57] ABSTRACT

A system for assembling a hard crystal blank onto a base which includes connecting pins, using an apparatus providing self-locating and self-fixturing features, is described. The apparatus comprises a hard crystal blank supporting structure which provides vertical, horizontal and transverse locating features. The vertical, horizontal and transverse locating features are contiguous to the crystal supporting structure and locate the hard crystal blank to the crystal supporting structure. The hard crystal blank once located may be secured to the crystal supporting structure with a suitable adhesive. Connecting features for securing the crystal supporting structure to the base are provided. Once the crystal supporting structure has been secured to the base, the vertical, horizontal and transverse locating features are separated from the crystal supporting structure. The hard crystal blank and crystal supporting structure so assembled are precisely aligned to the base.

29 Claims, 6 Drawing Figures

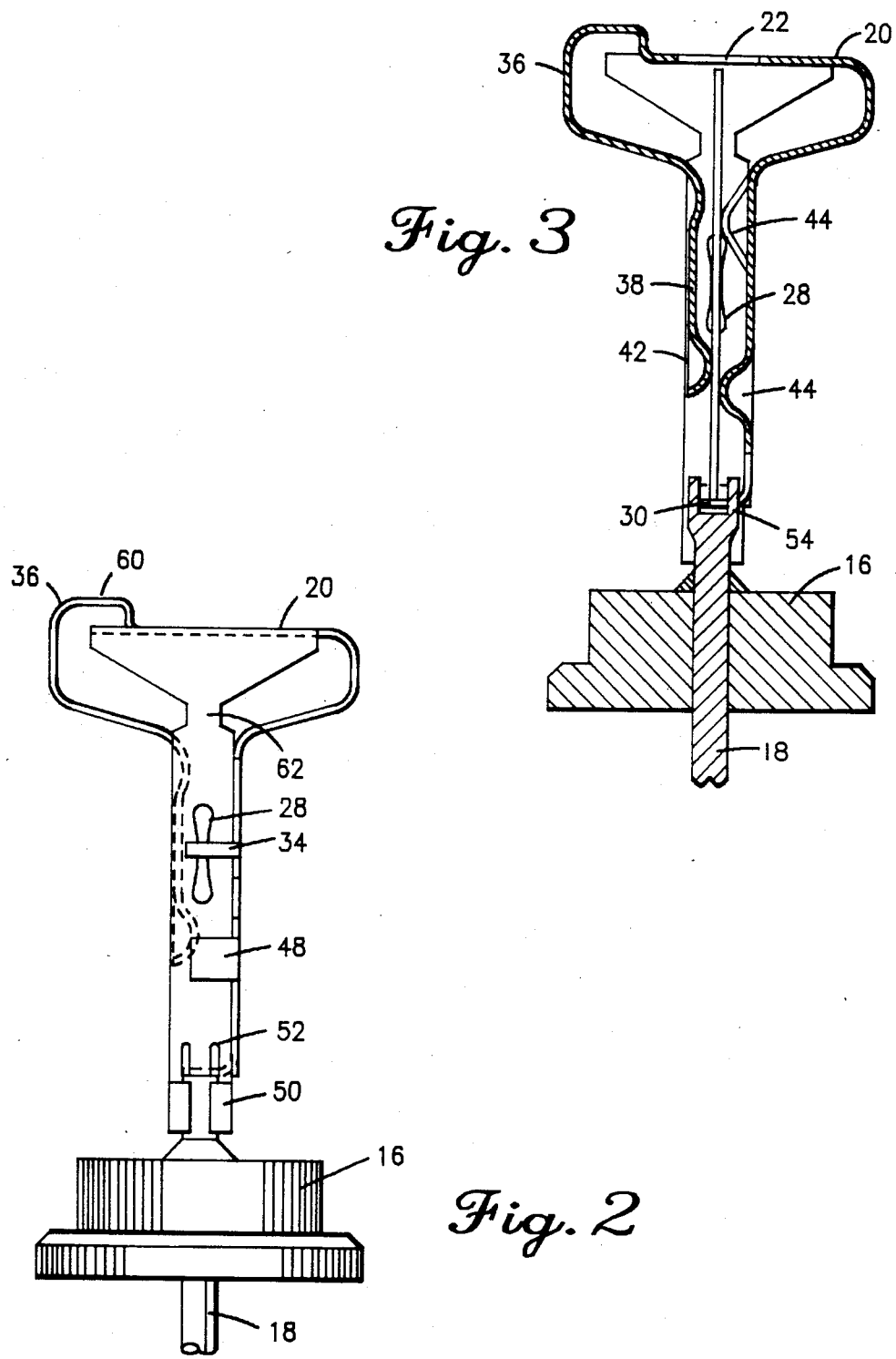

4,706,350

SELF-LOCATING, SELF-FIXTURING HARD CRYSTAL BLANK MOUNTING SYSTEM

This is a continuation-in-part of application Ser. No. 06/689,639, filed Jan. 7, 1985, now abandoned.

FIELD OF THE INVENTION

This invention relates to a method and apparatus for mounting hard crystal blanks for electrical applications. More particularly, the invention relates to a hard crystal blank mounting system utilizing an apparatus to provide self-locating and self-fixturing functions for the assembly of hard crystal blanks to a mounting base.

BACKGROUND OF THE INVENTION

Crystal devices which are ground to dimensions to cause a vibration at a specific frequency when energy is supplied are employed in a large number of electrical applications. For example, such devices are used to establish the transmitting frequency of fixed frequency transmitters or to provide a stable reference frequency for frequency synthesizers. Such crystal devices often include two or more electrical connecting pins which are adapted to be soldered into a printed circuit board or plugged into a corresponding socket. These crystal devices generally employ a metal cannister providing environmental protection to the crystal blank. Means internal to the metal cannister are provided for effecting support of the crystal blank and connection to the electrical connecting pins.

The frequency determining characteristic of a crystal blank is its resonant frequency which depends primarily upon the thickness and the dimension perpendicular to the thickness of the crystal blank. Such crystal blanks are often circular and on the order of 0.2 inches in diameter and between approximately 0.002 and 0.006 inches thick. It will be appreciated that such crystal blanks being very thin and crystalline are therefore very brittle and delicate. The necessity of protecting such crystal blanks during the manufacture and use of such devices is obvious.

Currently, such devices are manufactured by manually mounting an appropriately dimensionsed crystal blank in a support with conductive epoxy. The blank is in turn fastened to electrical conducting pins, such as glass sealed crystal base pins. Presently available crystal devices suffer from a number of substantial disadvantages due to improper crystal blank location in the mounting slots of the supports resulting in a lack of consistent shock performance. Another disadvantage suffered by present crystal devices is inconsistent electrical performance due again to improper crystal blank location in the mounting slots of the supports. The mounting slots may be generally too large or inconsistent in size, and the conductive adhesive can leak through the spaces formed between the crystal blank and the slot. Both of the performance disadvantages of the presently available crystal devices translate directly into higher manufacturing costs as a result of lower production yields of intact and properly functioning crystal devices. Both of the disadvantages also result in decreased customer satisfaction and increased warranty costs for products utilizing the presently available crystal devices. Another disadvantage of prior art crystal devices is the high cost associated with fastening the crystal supports to the electrical connecting pins. This step is highly labor intensive and therefore costly. If great care is not exercised in the fastening process, the problems associated with mounting the crystal blank into the slots of the supports may be compounded.

There continues to be a need for a crystal device that is reliable, less susceptible to shock, especially during manufacture, and inexpensive to produce. Various crystal mounting systems have been proposed to obtain the results required. One such crystal mounting system shows that crystal supports may be independently formed and connected to the electrical connecting pins. This approach, as with other prior art approaches, relies on properly aligning the supports to the electrical connecting pins. Once aligned, the support which incorporates a long slot slightly wider than the thickness of the crystal blank thickness, and a prong having a slit slightly wider than the thickness of the crystal blank and located at the upper end of each support are used in an effort to maintain the alignment of the crystal to the base. Neither this approach nor other prior art approaches have addressed the issues of properly aligning the crystal blank to the base while simplifying the connection of the crystal support to the electrical connecting pins.

SUMMARY OF THE INVENTION

The system described in this invention utilizes an apparatus providing self-locating and self-fixturing features designed to allow simplified assembly of the crystal blank to the crystal supports. The apparatus provides means to retain the crystal blank in the crystal supports, and provides horizontal, vertical and transverse locating for the crystal blank. The apparatus incorporates a unique design for the slot in the crystal support to overcome prior art problems with conductive adhesive applications to secure the crystal blank in the slot. After the crystal blank has been secured in the apparatus, the apparatus allows simple mounting to a conventional crystal base. Once the apparatus has been mounted to the crystal base, it can be secured by conventional means such as resistance welding. The horizontal, vertical and transverse locating means are then removed using conventional techniques as laser cutting. After the locating means have been removed, the crystal blank continues to be precisely oriented to the crystal base. The invention described is suitable for use in crystal blank assembly operations allowing for automation of the assembly processes.

It is therefore an object of the present invention to provide a new and improved self-locating, self-fixturing hard crystal blank mounting system.

- It is a further object of the invention to provide a new and improved self-locating and self-fixturing hard crystal blank mounting system which includes an apparatus which facilitates the manufacture of reliable and shock resistant crystal devices.

It is a still further object of the invention to provide an apparatus for an improved hard crystal blank mounting system which can be fabricated easily and inexpensively.

It is a still further object of the invention to provide a method of assembling hard crystal blanks utilizing a new and improved self-locating, self-fixturing hard crystal blank mounting system.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like reference numerals identify identical elements, and wherein:

FIG. 2 is a side view of the embodiment of the present invention illustrated in FIG. 1.

FIG. 3 is a section view of the embodiment of the present invention illustrated in FIG. 1 taken along lines 3—3.

DESCRIPTION OF THE PREFERRED EMBODIMENT

Figure 1:
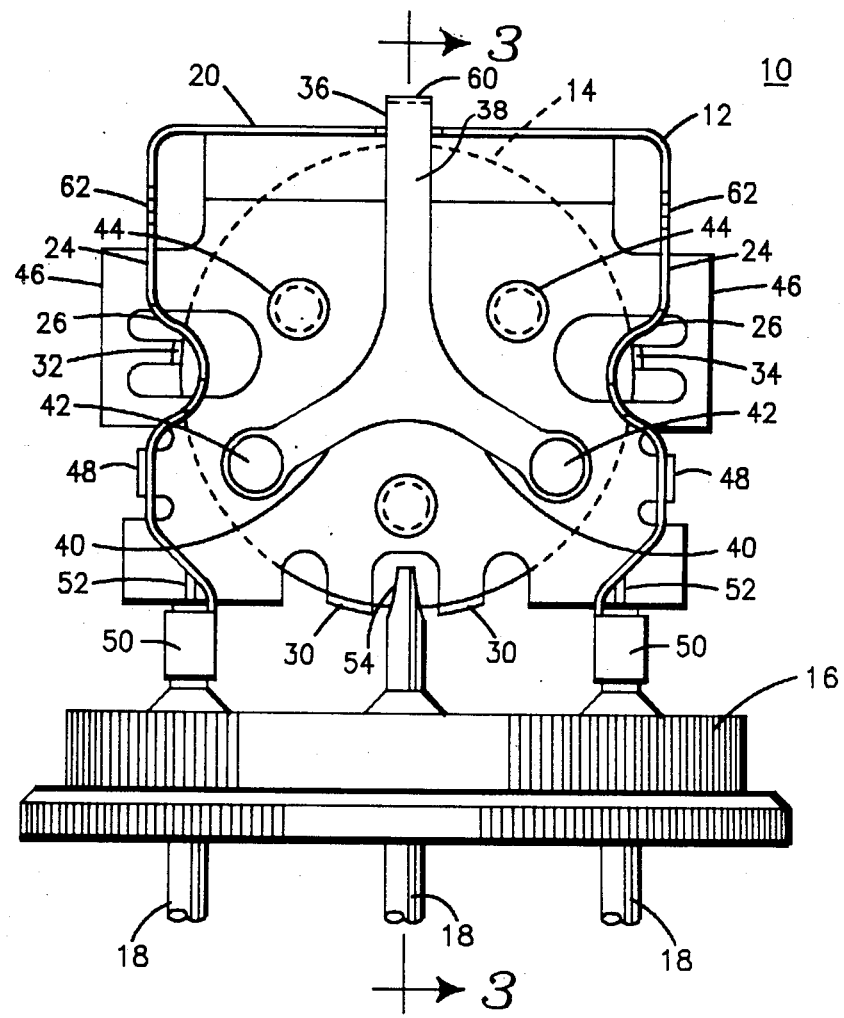
FIG. 1 is a front view of a self-locating, self-fixturing hard crystal blank mounting system in accordance with the present invention.

With respect to the figures, FIGS. 1 through 6 illustrate the preferred embodiment of a self-locating, self-fixturing, hard crystal blank mounting system 10 in accordance with the present invention. The system 10, as illustrated in FIG. 1, includes an apparatus, or fixture 12, shown with a hard crystal blank 14 inserted therein and shown partially in phantom. The system 10 is shown in conjunction with a base 16, which may be of any suitable material such as steel or glass, and includes electrical connecting pins 18. It should be noted that three connecting pins are illustrated only by way of example and that any number of pins suitable to a given device application may be employed without departing from the spirit and scope of the invention.

In the preferred embodiment, the fixture 12, as described in detail hereafter, is fabricated from a single piece of suitable sheet metal material, such as stainless steel on the order of 3–5 mils thick. Such a single piece construction imparts many desirable qualities, not the least among them is ease of manufacture. Another advantage of fabrication from a single sheet is that the fixture produced is generally more precise in size and dimensions than a fixture produced from separately manufactured parts which are then joined together, such as by soldering or welding. This is because the loss of precision due to tolerance build-up, which is inherent in fabricating a fixture from separately manufactured parts, is substantially eliminated. Yet another advantage of fabrication from a single sheet is that the fixture may be multiply formed in a strip further allowing for automation of the assembly process to be described in detail hereafter.

Figure 4:
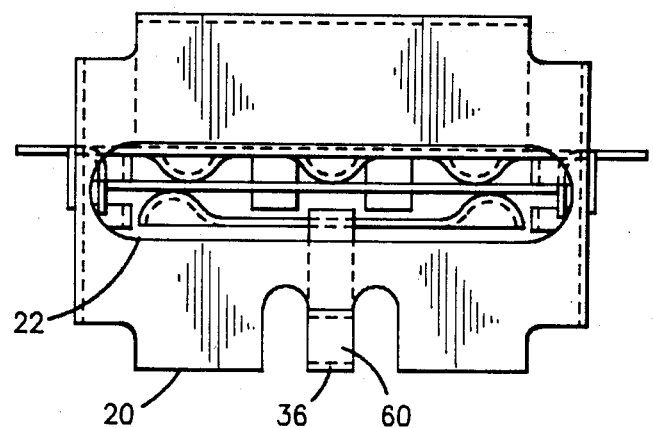
FIG. 4 is a top view of the embodiment of the present invention illustrated in FIG. 1.
Figure 6:
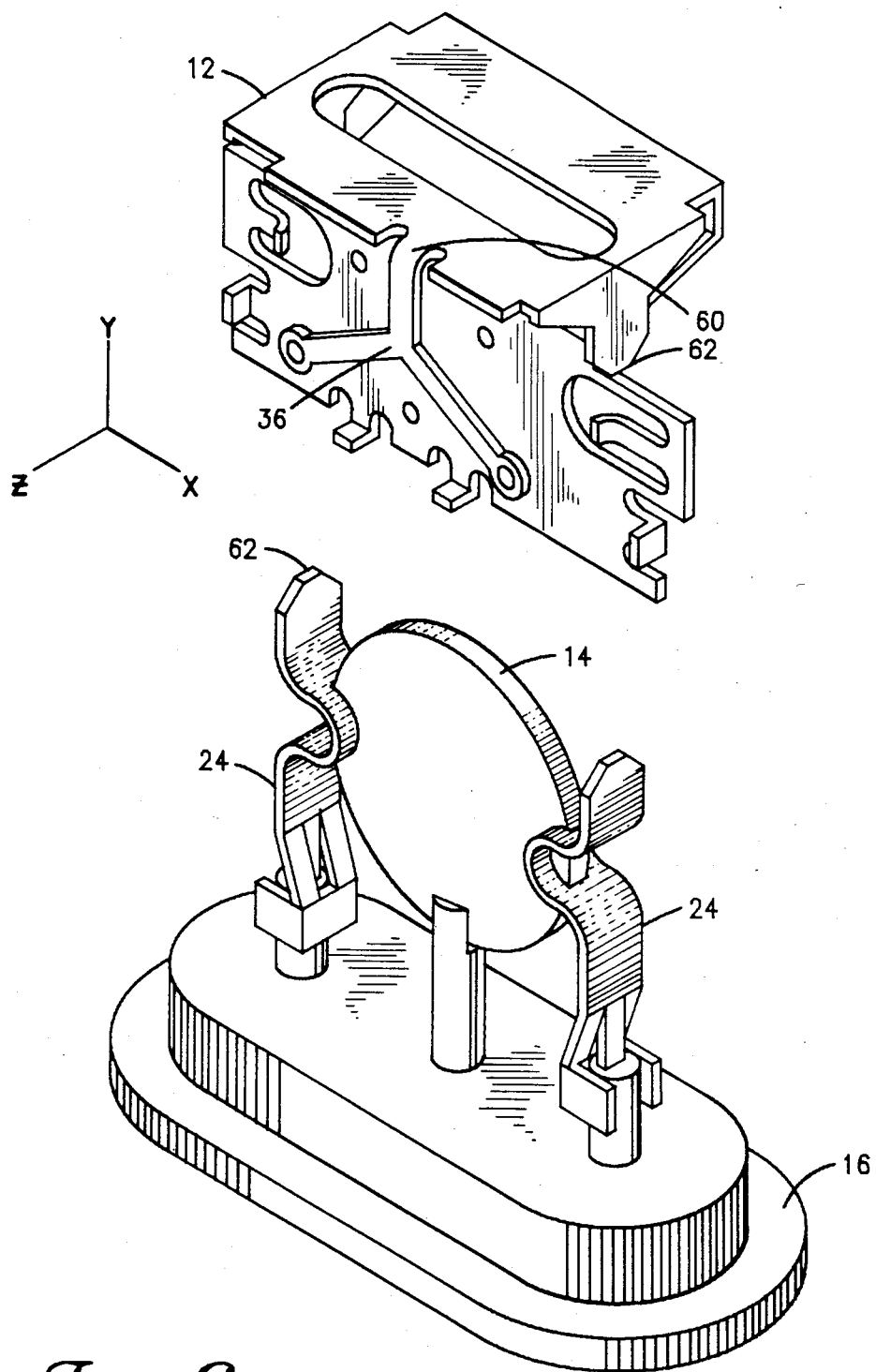
FIG. 6 is an isometric view of the embodiment of the present invention illustrating the removal of the locating means from the secured and properly aligned hard crystal blank.

More particularly, the fixture 12 includes a top wall 20 with opening 22 as illustrated more clearly in FIG. 4 through which a crystal blank 14 is inserted between the fixture side walls 24 into fixture 12. Each side wall 24 includes means for receiving the edge of crystal blank 14 and is illustrated in FIG. 1 as indented portions 26. In the embodiment, each indented portion 26 has a biconcave slot 28 as illustrated more clearly in FIG. 2. Slot 28, fabricated in this configuration, serves to more precisely locate crystal blank 14 in the X-Y plane. The X, Y and Z orientations referenced to describe the mounting of crystal blank 14 are illustrated in FIG. 6. Slot 28 also serves as a further aid to self-fixturing during the application of appropriate well known adhesives to provide both mechanical fastening and electrical contact between crystal blank 14 and each indented portion 26 of side walls 24.

The biconcave slot 28 facilitates more precise adhesive application by reducing adhesive leakage through the slot and away from the point of application. This results in more consistent electrical performance and reduced manufacturing costs due to the more precise adhesive application compared to prior art techniques relying largely on controlling the volume of applied adhesive so as to limit adhesive leakage away from areas of the crystal blank which would potentially cause operational problems. Control of adhesive application is usually visually and manually performed, and in prior art techniques, often leads to insufficient adhesive application, resulting in poor reliability of the finished crystal device.

In the preferred embodiment, fixture 12 is not attached to the base 16 when crystal blank 14 is inserted into the fixture but only after securing crystal blank 14 into fixture 12 does the base 16 get attached as described in detail hereafter. Constraining tabs 48, as illustrated in FIGS. 1 and 2 are preferably formed contiguous to the back plate 46, preventing side walls 24 from separating and deforming when crystal blank 14 is inserted into fixture 12. Since constraining tabs 48 are not fastened to the side walls 24, side walls 24 can flex allowing the indented portions 26 to spread sufficiently to insert crystal blank 14 into fixture 12. Upon insertion of crystal blank 14, constraining tabs 48 maintain the position of side walls 24, thereby captivating crystal blank 14 in slots 28 prior to application of an adhesive. The crystal blank 14 is now protected during the balance of the manufacturing process.

A further feature of the fixture 12 is the means to precisely locate crystal blank 14 in the X-Y plane. Such means, shown in FIGS. 1 and 2, are the positioning tabs 32 and 34 contacting the perimeter of the crystal blank 14 on either side in the indented portion 26 of side walls 24. One such positioning tab, the stop tab 32, is formed preferably contiguous to the back plate 46 and is rigid. Stop tab 32 provides a reference point to precisely locate crystal blank 14 in the X-Y plane. A second positioning tab, spring tab 34, is also formed preferably contiguous to the back plate 46. The length of spring tab 34 is substantially longer than stop tab 32, therefore providing some flexibility. Spring tab 34 provides for variations in the diameter of crystal blank 14 to maintain the position of crystal blank 14 against the stop tab 32.

Prior art crystal devices rely largely on the positioning of the crystal supports to the base to obtain the horizontal or X-Y plane position. Should these supports be deformed, the resultant location of the prior art crystal can cause problems later in the manufacturing process. An additional feature of the fixture 12 shown in FIGS. 1 and 3 is the configuration of the bottom receiving and supporting means. In the fixture 12, flanges 30 act to receive and support crystal blank 14 and to locate crystal blank 14 in the X-Z plane. The fixture 12 does not rely on a center pin 54 to control the position as in some prior art methods. Since many crystals require only two electrical connecting pins, prior art may not adequately locate the crystal blank in the X-Z plane.

The back support 46 in the fixture 12 is a solid wall portion which is formed contiguous with the top wall 20. The back support 46 further includes means for supporting crystal blank 14 quite precisely in a planar orientation in the X-Y plane located with respect to slots 28. Such supporting means are illustrated in FIGS. 1 and 3 as convex nodes or protuberances 44. Nodes 44 are sized and located to facilitate the necessary support and proper reference positioning in the X-Y plane for the crystal blank 14. The back support 46 in conjunction with the design of slots 28 provide greater precision in locating the crystal blank 14 in the X-Y plane and further insure the crystal blank will be positioned perpendicular to the base when completely assembled. Prior art systems rely on very tight tolerance slots which can lead to increased costs of the crystal base and supports as well as complicate assembly due to the tight tolerance slots.

A front support 36 which is shown in FIG. 1 is illustrated in this embodiment in the shape of an inverted Y having a base 38 and arms 40. The base portion is formed preferably contiguous with the top 20 (as more clearly shown in FIG. 6) and resilient to allow the crystal blank 14 to be inserted through opening 22 and held in position between front support 36 and back support 46 to locate and maintain crystal blank 14 in a planar orientation in the X-Y plane. It has been found that a spring tension of between one (1) and fifty (50) grams on crystal blank 14 is a generally suitable compromise to allow ease of insertion of crystal blank 14 and maintain a proper degree of self-fixturing. This configuration of front and back supports also provides a substantial amount of shock resistance for the crystal blank 14 during subsequent manufacturing processes. This advantage is completely lacking in the prior art.

Arms 40 of the front support 36 preferably have a their ends, convex nodes or protuberances 42 for making a smaller area contact with the crystal blank 14. Arms 40 further contribute to more precise planar orientation of the crystal blank 14 in the X-Y plane so that, on insertion through opening 22, the crystal blank 14 slides neatly and readily into slots 28. Such a configuration as described for fixture 12 lends itself quite readily to high volume mechanical production without sacrificing quality.

Figure 5:
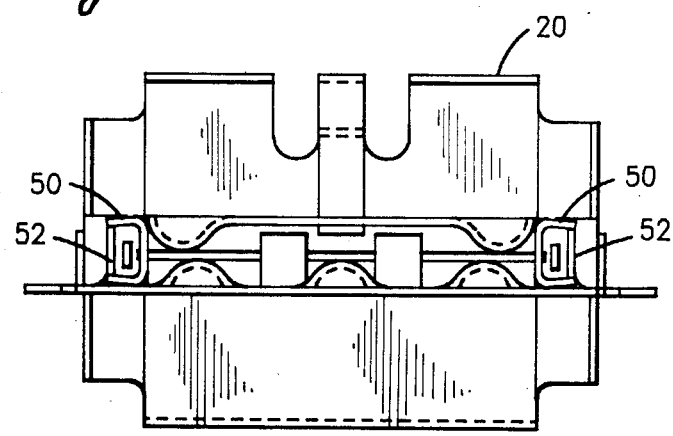
FIG. 5 is a bottom view of the embodiment of the present invention illustrated in FIG. 1.

As shown in the preferred embodiment for fixture 12 in FIGS. 1 and 5 is the bottom terminus of the sides 24 to allow the fixture 12 to be connected to pins 18 of the base 16. The bottom terminus consists of a connector 50 formed contiguous with the side wall 24 and a tab 52 also formed contiguous with the side wall 24. Connector 50, as illustrated more clearly in FIG. 5, preferably is U-shaped in cross-section being narrower at the open end of the U and somewhat smaller than the smallest diameter of pin 18. Connectors 50 function to form electrical and mechanical connections with connecting pins 18 as illustrated in FIG. 1. The form of the connector 50 allows it to gras the pin, spreading to conform to the diameter of pin 18, thereby providing a secure mechanical connection.

As also illustrated in FIGS. 1 and 2, fixture 12 is positioned on pins 18 until tab 52 bottoms on the tops of pins 18, thereby locating the frame 12 with respect to the base 16 uniformly from unit to unit. The configuration of connectors 50 insures that fixture 12 is properly positioned perpendicular to the base 16 without the need for fixturing the crystal support to the base prior to receiving the crystal blanks as required in prior art designs. Once fixture 12 has been attached to the base, connectors 50 are securely fastened to the pins by means of welding or other suitable means. Using this procedure, crystal blank 14 is securely mounted to the base eliminating the prior art costly and potentially detrimental practice of first attaching the crystal mounting tabs to the base pins.

The fixture 12 of the preferred embodiment further shows a means for providing additional electrical connections to crystal blank 14 as illustrated in FIG. 1. The center pin of base 16 has a preferably U-shaped head 54 as illustrated in FIG. 3. The U-shaped head 54 facilitates the use of an appropriate adhesive to provide both mechanical fastening and electrical contact to the crystal blank 14 after the fixture 12 has been securely attached to the base 16 and electrically connecting pins 18.

The operation of inserting, automatically aligning and securing the crystal blank 14 into fixture 12 has been described in connection with the detailed description of the apparatus. Once crystal blank 14 has been properly located and secured to the side walls 24 of fixture 12, and side walls 24 have been properly secured to pins 18 of base 16, the fixture 12 is removed from the side walls 24 connecting the crystal blank 14 to base 16. The steps in the process of separation are illustrated in FIG. 6. First, front arm 36 comprising inverted Y base 38 and arms 40 is separated from top 20 of fixture 12 by cutting through base 38 in an area 60 as shown in FIG. 6 and also in FIG. 2. This may be accomplished by means of a laser to cut the sheet metal in the pattern area 60 shown. It will be appreciated that other forms of cutting may be used to accomplish the same result.

Next, the modified fixture 12 consisting of the top 20 and back support 46 is separated from the side arms 24 at an area 62 shown in FIG. 6. Again, laser cutting or other suitable means of cutting may be employed in the pattern areas 62 also shown in FIGS. 1 and 2. Once these cuts have been made, the remaining part of fixture 12 can be removed leaving the crystal blank 14 secured to side walls 24, and further secured to the base 16.

The crystal blank 14 so disposed is precisely aligned and secured to the base 16 and connecting pins 18. While fixture 12 is no longer part of the assembly, the use of fixture 12 in assembling and precisely aligning crystal blank 14 to the base 16 and its distinct manufacturing and cost advantages are plainly evident. The advantages of protecting the crystal blank during the manufacturing operations lead to improved yields due to fewer broken or scratched crystal blanks.

The unique slot design and combination of vertical, horizontal and transverse locating means included in fixture 12 allows for automation of the assembly process, including but not limited to insertion of the crystal blank 14 into the fixture 12, adhesive application, fixture to base assembly and welding operations and fixture removal operations. Because crystal blank 14 is precisely oriented to the base 16, fewer problems are encountered when the cannister providing environmental protection of the crystal blank 14 is on and secured to the base. In conclusion, a substantially more reliable crystal device for use in electronic applications is available.

What is claimed is:

1. An apparatus providing self-locating and self-fixturing means for the assembly of a hard crystal blank onto the base, the base including a plurality of pins for electrical connection to the hard crystal blank, said apparatus comprising:

crystal supporting means for receiving and supporting the hard crystal blank;

vertical locating means for locating the hard crystal blank in the vertical or Y—Y direction;

horizontal locating means for locating the hard crystal blank in the horizontal or X—X direction;

transverse locating means for locating the hard crystal blank in the transverse or Z—Z direction, said vertical, horizontal and transverse locating means being detachably connected to said crystal supporting means for locating and fixturing the hard crystal blank to said crystal supporting means;

means for securing the located and fixtured hard crystal blank to said crystal supporting means; and connecting means for securing said crystal supporting means to the plurality of pins in the base;

whereby, when said vertical, horizontal and transverse locating means are detached from said crystal supporting means, the hard crystal blank is secured to said crystal supporting means and said crystal supporting means is further secured to the plurality of pins such that the hard crystal blank is precisely aligned to the base.

2. The apparatus according to claim 1 wherein said crystal supporting means comprises a top wall and a pair of side walls, each of said side walls including at least one indented portion with the means for receiving the edge of the crystal blank.

3. The apparatus according to claim 2 wherein said indented portions include slots.

4. The apparatus according to claim 3 wherein said slot is biconcave.

5. The apparatus according to claim 2 wherein said top wall includes an opening through which the crystal blank can be inserted into said apparatus.

6. The apparatus according to claim 2 wherein said crystal supporting means further connects to back supporting means, said back supporting means being contiguous with said top wall.

7. The apparatus according to claim 6 wherein said back supporting means comprises said vertical locating means, said horizontal locating means and said transverse locating means for locating the crystal blank.

8. The apparatus according to claim 7 wherein said vertical locating means includes at least one flange contiguous with said back supporting means, said flange receiving and supporting the crystal blank in said Y—Y direction.

9. The apparatus according to claim 7 wherein said horizontal locating means laterally locates the crystal blank between said side walls in said X—X direction.

10. The apparatus according to claim 9 wherein said horizontal locating means includes at least a first and a second locating tab, both of said tabs contiguous with said back supporting means.

11. The apparatus according to claim 10 wherein said first locating tab is rigid serving to precisely locate one edge of the crystal blank between said pair of side walls.

12. The apparatus according to claim 10 wherein said second locating tab engages a second edge of the crystal blank.

13. The apparatus according to claim 12 wherein said second locating tab allows for variations in diameter of the crystal blank and maintains said crystal blank against said first locating tab.

14. The apparatus according to claim 7 wherein said transverse locating means locates and supports the crystal blank in a Z—Z direction.

15. The apparatus according to claim 14 wherein said transverse locating means comprises a plurality of cup like protuberances to facilitate supporting the crystal blank parallel to the X-Y plane.

16. The apparatus according to claim 7 wherein said back supporting means further comprises constraining means to prevent said side walls from being spread or deformed in the lateral or X—X direction.

17. The apparatus according to claim 16 wherein said constraining means includes at least a pair of tabs contiguous with said back supporting means to constrain the horizontal spreading of said side walls.

18. The apparatus according to claim 6 wherein said crystal supporting means further connects to front supporting means for further locating the crystal blank parallel to the X-Y plane.

19. The apparatus according to claim 18 wherein said front supporting means consists of a base portion and at least two arm portions, said base portion being contiguous with said top wall and the ends of said arm portions being in contact with and exerting force on the crystal blank.

20. The apparatus according to claim 19 wherein said front supporting means is arranged to exert a resilient force on the crystal blank of approximately 1 to 50 grams.

21. The apparatus according to claim 19 wherein each of said arm portions includes a cup-like protuberance for supporting and fixturing the crystal blank to facilitate self-locating and self-fixturing.

22. The apparatus according to claim 2 wherein each of said side walls further includes means for connecting said apparatus to the crystal base.

23. The apparatus according to claim 22 wherein said connecting means comprises fastening means contiguous with each of said side walls and locating means contiguous with each of said side walls and positioned above said fastening means.

24. A method for assembling a hard crystal blank onto a base, said base including a plurality of pins for providing electrical connection to said hard crystal blank, said method of assembly using an apparatus providing self-locating and self-fixturing means, said apparatus comprising crystal supporting means, vertical locating means, horizontal locating means, and transverse locating means, said crystal supporting means further including connecting means, said method of assembly comprising the steps of:

a. inserting said hard crystal blank into said crystal supporting means whereby said hard crystal blank is precisely located and oriented with respect to vertical, horizontal, and transverse directions within said crystal supporting means;

b. securing said hard crystal blank to said crystal supporting means;

c. attaching said hard crystal blank secured to said crystal supporting means to said base including said plurality of pins for providing electrical connection to said hard crystal blank;

d. securing said crystal supporting means to said plurality of pins;

e. separating said vertical, horizontal and transverse locating means from said crystal supporting means secured to said base;

thereby leaving said hard crystal blank secured to said crystal supporting means, said crystal supporting means further secured to said plurality of pins and therefore said hard crystal blank being precisely oriented to said base.

25. The method according to claim 24 wherein said means to secure said hard crystal blank to said crystal supporting means comprises an adhesive.

26. The method according to claim 25, wherein said adhesive is conductive epoxy.

27. The method according to claim 24 wherein said means for securing said connecting means to said plurality of pins provides mechanical and electrical connection means.

28. The method according to claim 27 wherein said mechanical and electrical connection means includes welding.

29. The method according to claim 24 wherein said means for separating said vertical, horizontal and transverse locating means from said crystal supporting means includes laser cutting.

* * * * *